(12) United States Patent
Schnell et al.

(10) Patent No.: US 7,579,835 B2
(45) Date of Patent: Aug. 25, 2009

(54) MULTI-LAYER RESONATOR FOR MAGNETIC RESONANCE APPLICATIONS WITH CIRCUITRY ALLOWING EQUAL MAGNITUDE CURRENT DURING ACTIVE OPERATION

(75) Inventors: Wilfried Schnell, Forchheim (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 163 days.

(21) Appl. No.: 11/606,162

(22) Filed: Nov. 28, 2006

(65) Prior Publication Data

US 2007/0120629 A1    May 31, 2007

(30) Foreign Application Priority Data

Nov. 28, 2005   (DE) ................. 10 2005 056 602

(51) Int. Cl.
*G01V 3/00* (2006.01)
*H01P 7/08* (2006.01)

(52) U.S. Cl. .................. 324/318; 324/322; 333/219; 333/219.1; 333/219.2

(58) Field of Classification Search ......... 324/318–322, 324/300–317; 333/219; 600/410, 411, 422, 600/423
See application file for complete search history.

(56) References Cited

U.S. PATENT DOCUMENTS

| | | | | |
|---|---|---|---|---|
| 2,769,148 A | | 10/1956 | Clogston | .............. 333/236 |
| 6,081,120 A | * | 6/2000 | Shen | .............. 324/318 |
| 6,148,221 A | | 11/2000 | Ishikawa et al. | ........... 505/210 |
| 6,798,204 B2 | * | 9/2004 | Seeber et al. | ............. 324/318 |
| 6,943,551 B2 | | 9/2005 | Eberler et al. | ............. 324/318 |
| 7,081,753 B2 | * | 7/2006 | Mullen et al. | ............. 324/318 |
| 7,136,023 B2 | * | 11/2006 | Reykowski | ............. 324/318 |
| 2004/0066195 A1 | * | 4/2004 | Reykowski | ............. 324/318 |
| 2004/0070397 A1 | * | 4/2004 | Seeber et al. | ............. 324/318 |
| 2006/0017438 A1 | * | 1/2006 | Mullen et al. | ............. 324/318 |
| 2007/0120629 A1 | * | 5/2007 | Schnell et al. | ............. 333/219 |
| 2008/0150643 A1 | * | 6/2008 | Suzuki et al. | ........... 331/107 R |
| 2008/0164960 A1 | * | 7/2008 | Schnell et al. | ........... 333/219.2 |

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

A resonator for magnetic resonance applications has a conductor element that extends from a first conductor end to a second conductor end. During operation of the conductor element at a resonance frequency, a resonance current-oscillates from the first conductor end to the second conductor end and back. The conductor ends are coupled with one another via a circuit that tunes the conductor element to the resonance frequency. The conductor element is fashioned as a multi-layer conductor with a number of layers that have first and second layer ends at the conductor ends. The circuit causes layer currents that are of equal magnitudes to flow in the layers themselves during active operation of the conductor element at the resonance frequency.

15 Claims, 5 Drawing Sheets

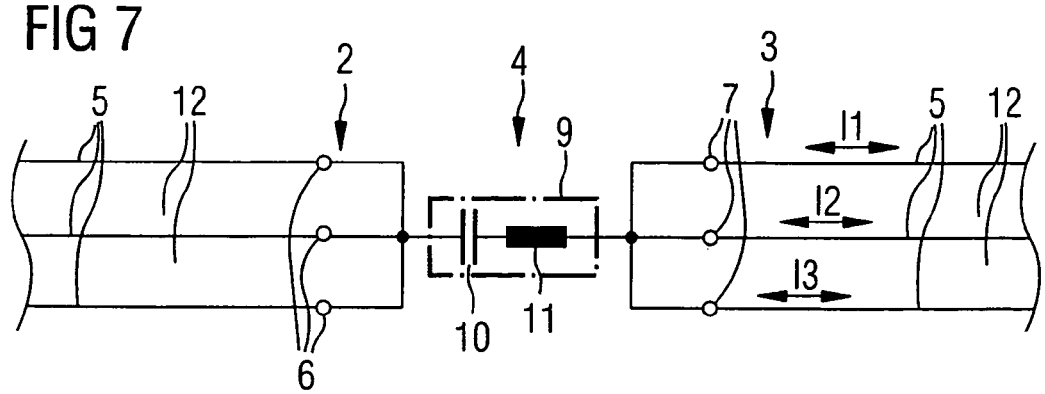
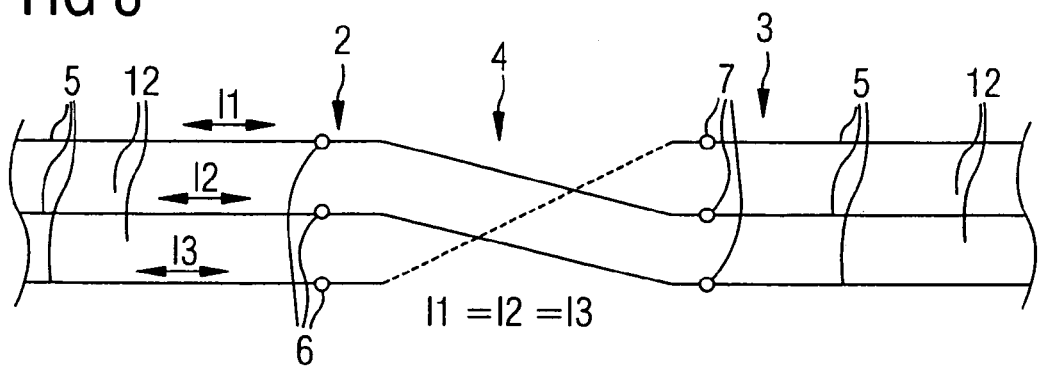
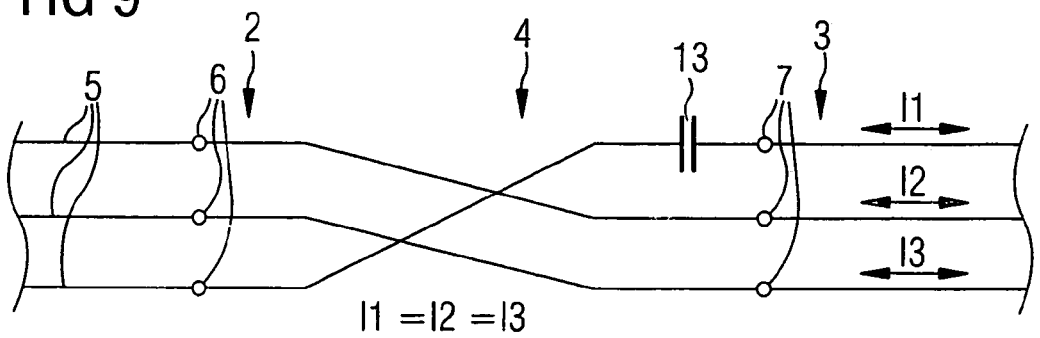

MULTI-LAYER RESONATOR FOR MAGNETIC RESONANCE APPLICATIONS WITH CIRCUITRY ALLOWING EQUAL MAGNITUDE CURRENT DURING ACTIVE OPERATION

BACKGROUND OF THE INVENTION

1. Field of the Invention

The present invention concerns a resonator for magnetic resonance applications, the resonator being of the type having a conductor element that extends from a first conductor end to a second conductor end.

2. Description of the Prior Art

Resonators of the above type are generally known, for example, from DE 103 14 215 A1 (corresponding to U.S. Pat. No. 6,943,551 B). During operation of the conductor element, a resonator current oscillates at a resonator frequency in the conductor element from the first conductor end to the second conductor end and back. The conductor element is tuned to the resonance frequency by a corresponding circuit. In DE 103 14 215 A1 the conductor element is an antenna rod of a birdcage resonator that has further antenna rods, ferrules, ring conductors running axially, centrally around the birdcage resonator and connection lines to the ring conductors. The elements cited above can be components of a multi-layer conductor trace foil.

Like many other resonators, resonators for magnetic resonance applications have a conductor element that extends form a first conductor end to a second conductor end. During operation of the conductor element, a resonance current oscillates with a resonance frequency in the conductor element (also like other resonators) from the first conductor end to the second conductor end and back. The resonator current is particularly high when the conductor element is tuned to the resonance frequency.

In magnetic resonance applications the Larmor frequency with which the magnetic resonance system is operated depends on the strength of the basic magnetic field of the magnetic resonance system and on the chemical element whose excited spin should be detected. For hydrogen (which is the most frequent application case), the gyromagnetic ratio is approximately 42.4 MHz/T.

Magnetic resonance systems are typically operated with basic magnetic fields that lie between 0.2 and 1.5 T. More recently times, magnetic resonance systems have become known that exhibit stronger basic magnetic fields, in particular basic magnetic fields of 3 T, in some cases even in particular to 5 T and more. The Larmor frequency of magnetic resonance system correspondingly typically lies between 8.5 MHz and approximately 63.5 MHz, but can even be above this in individual cases.

The Larmor frequency is the frequency to which the resonators must be tuned in magnetic resonance applications. In the ideal case it thus corresponds to the resonance frequency of the resonator.

As is generally known, a conductor element is resonant at a resonance frequency without further measures when its length is half of the wavelength of the resonance frequency. As results from a simple calculation, the length of a $\lambda/2$ rod is thus approximately 2.5 m for a magnetic resonance system with a basic magnetic field of 1.5 T. Such lengths are unrealistic for resonators for use in magnetic resonance applications. For example, the rods of whole-body antennas exhibit lengths that normally are approximately 40 cm, and in practice do not exceed 60 cm. Local coils are often substantially smaller. For this reason, for resonators for magnetic resonance applications it is not possible without further measures to achieve tuning to the Larmor frequency by dimensioning of the conductor element. Rather, it is generally typical to couple the conductor ends with one another via a corresponding circuit, and the circuit effects the tuning of the conductor element to the resonance frequency. The present invention assumes resonators fashioned in such a manner.

Even when the conductor elements in resonators for magnetic resonance systems are significantly shorter than half of the wavelength of the resonance current oscillating in the conductor element, the resonance current is nevertheless at radio-frequency. In the case of radio-frequency currents, an effect known as the skin effect occurs: the resonance current no longer flows in the entire cross-section of the conductor element, but rather only in a boundary or border region thereof. The boundary region exhibits a skin depth that is determined by the resonance frequency and the material of which the conductor element is composed. Due to the skin effect, the resonance current thus flows only in a fraction of the cross-section of the conductor element, so the effective resistance of the conductor element increases. Measurements show an increase that is proportional to the square of the resonance frequency.

It is conceivable to reduce the effective resistance of the conductor element via cooling or by the use of a superconducting material. These procedures, however, would involve a significant technical expenditure and moreover represent a safety risk for a patient who is examined in the magnetic resonance system. They are therefore normally not used in practice in magnetic resonance systems.

The use of a radio-frequency braid is also eliminated in practice. Braided conductors reduce the resistance only up to frequencies of a few megahertz, typically 2 to 4 MHz.

Conductor elements are known that are fashioned as multi-layer conductors. Examples of such multi-layer conductors are disclosed in U.S. Pat. Nos. 2,769,148 and 6,148,221. When, in such a case, the individual layers exhibit layer thicknesses that are smaller than the skin depth, the effective resistance at the resonance frequency can be significantly reduced with such conductor elements. The layers can be either concentric relative to one another (known as a Clogston conductor, see U.S. Pat. No. 2,769,148) or planar (see, for example, U.S. Pat. No. 6,148,221). If such conductor elements could be used in resonators for magnetic resonance apparatuses, this would be advantageous. However, the use of multi-layer conductors as conductor elements does not lead to the expected reduction of the effective resistance without further measures.

More precise tests have shown that the problem is that the optimal distribution of the resonance current among the individual layers of the multi-layer conductor after a transition from a solid (non-layered) conductor or an external circuit to the multi-layer conductor ensues only after a length that is greater than the wavelength corresponding to the resonance frequency. As stated in the preceding, since the resonators for magnetic resonance apparatuses exhibit lengths that are distinctly smaller than the wavelength of the resonance frequency, this current distribution does not have the opportunity to occur. Moreover, slight inhomogeneities of the multi-layer conductor lead to a significant reduction of the achievable resistance decrease. The use of multi-layer conductors in resonators in resonators for magnetic resonance applications has conventionally not been thought to be reasonable in practice.

SUMMARY OF THE INVENTION

An object of the present invention is to provide a resonator for magnetic resonance applications in which the effective resistance is distinctly smaller than for a solid (unitary) conductor.

This object is achieved in accordance with the invention by a resonator of the type having a conductor extending from a first conductor end to a second conductor end, wherein the conductor element is a multi-layer conductor with a number of layers that exhibit layer first and second ends at the conductor ends and that is connected to a circuit that causes layer currents that are of equal magnitudes relative to one another to flow in the layers during operation of the conductor element at the resonance frequency.

Due to the fashioning of the conductor element as a multi-layer conductor, the possibility exists for the first time to distinctly reduce the effective resistance of the conductor element relative to a solid conductor. Due to the formation of the circuit that effects the uniform current distribution into the individual layers, this possibility is then actually enabled to be utilized.

It is possible for the circuit to couple the two conductor ends directly with one another. This procedure will normally be undertaken for annularly-fashioned resonators, thus in particular for local coils. It is also possible for the circuit to couple the two conductor ends via a ground area. This procedure will normally be undertaken for resonators fashioned in rod-shapes, thus in particular for whole-body antennas.

Several variations are possible with regard to embodiments of the circuit.

For example, the circuit can interconnect the layer ends with one another such that the layers are connected with one another in series.

Due to the circumstance that the effective length of the conductor element is thereby enlarged, it can occur that the effective length of the conductor element in connection with the intrinsic, unavoidable parasitic capacitive coupling of the first (viewed in the current flow direction of the resonance current) of the layers connected in series and the last (viewed in the current flow direction of the resonance current) of the layers connected in series directly results in the necessary tuning to the operating frequency. In this special case these first and last layers are not directly connected with one another by means of an electrical structural element.

However, the simple connection in series of the individual layers normally still does not produce the necessary tuning to the resonance frequency. Therefore the first (viewed in the current flow direction of the resonance current) of the layers connected in series and the last (viewed in the current flow direction of the resonance current) of the layers connected in series are normally directly connected with one another by a first capacitor.

It is possible to effect the tuning of the conductor element to the resonance frequency exclusively by means of the first capacitor, however, it is also possible to achieve this tuning by a number of capacitors. In this case the circuit has at least one second capacitor that is connected in series with the first capacitor. Viewed in the current flow direction of the resonance current, at least one of the layers is arranged between the first capacitor and the second capacitor. In this embodiment it is possible to arrange respective capacitors between each two layers abutting one another (viewed in the current flow direction).

As an alternative to the series connection of the layers, it is possible for the circuit to interconnect the layer ends with one another such that the layers are connected in parallel with one another. In this case, for each layer the circuit has impedance adaptation circuits individually associated with the respective layers, each impedance adaptation circuit being directly connected with one of the layer ends of the layer associated with it. Each impedance adaptation circuit can be formed by a capacitor and/or a coil.

Given parallel connection of the layers it is possible for each impedance adaptation circuit to also be directly connected with the other of the layer ends of the layer associated with it. In this case the layers are thus tuned to the resonance frequency independently of one another.

It is also possible for each impedance adaptation circuit to be connected with the other of the layer ends of the layer associated with it via a connection region common to the impedance adaptation circuits. In this case a residual circuit can be arranged in the common connection region. Analogous to the impedance adaptation circuits, the residual circuit can be formed by a capacitor and/or a coil.

The layers can be continuous (end-to-end) as viewed in cross-section, but it is also possible for the layers to be respectively formed by a number of strips or bands. In this case the circuit is advantageously fashioned such that, given operation of the conductor element, strip currents flow in the strips with the resonance frequency, the strip currents being of equal magnitude among one another per layer. The resistance reduction can thereby be optimized. The analogous measures that were explained in the preceding for realization of layer currents of equal magnitude are thereby possible for realization of the strip currents of equal magnitude.

The division of the individual layers into a number of strips is known in multi-layer conductors. In contrast to known arrangements, in the context of the present invention it is possible, at the operating frequency, for the strips to exhibit strip widths that are larger than the skin depth of the material of which the strips are composed.

DESCRIPTION OF THE DRAWINGS

FIGS. 7 through 12 show examples of circuits for the resonators of FIGS. 1 through 6.

DESCRIPTION OF THE PREFERRED EMBODIMENTS

Figure 1:
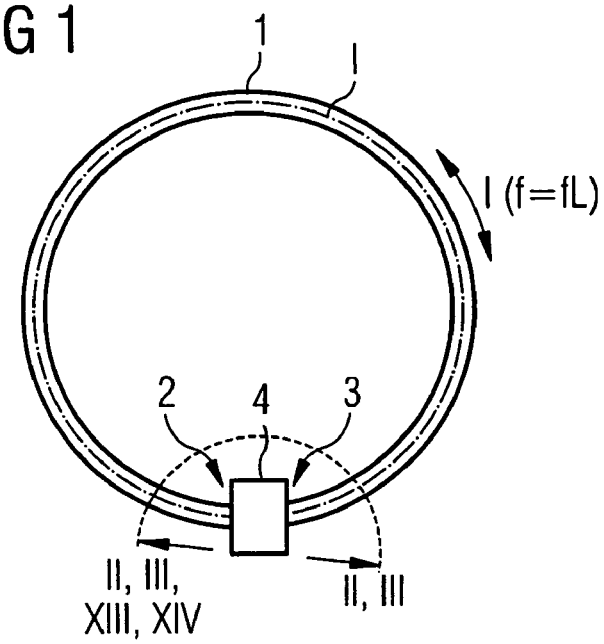
FIG. 1 shows a basic design of a resonator for magnetic resonance applications in accordance with the invention.

According to FIG. 1, a resonator for magnetic resonance applications has a conductor element 1 that extends from a first conductor end 2 to a second conductor end 3. During operation of the conductor element 1, a resonance current I oscillates with a resonance frequency f in the conductor element 1 from the first conductor end 2 to the second conductor end 3 and back.

In magnetic resonance applications the resonance frequency f corresponds with the Larmor frequency fL of a magnetic resonance system. The conductor element 1 therefore extends over a length l that is significantly smaller than half of the wavelength corresponding with the resonance frequency f. The conductor ends 2, 3 are coupled with one another via a circuit 4, whereby the conductor element 1 is tuned to the resonance frequency f by the circuit 4.

The conductor element 1 of FIG. 1 forms essentially an annular shape. It is therefore possible for the circuit 4 to directly couple the two conductor ends 2, 3 with one another. Such a design is normally presented in local coils.

Figure 2:
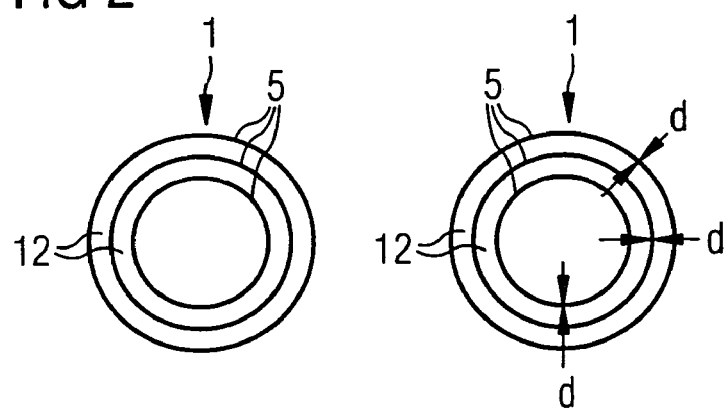
FIGS. 2 and 3 show examples of cross-sections of the resonator of FIG. 1.
Figure 3:
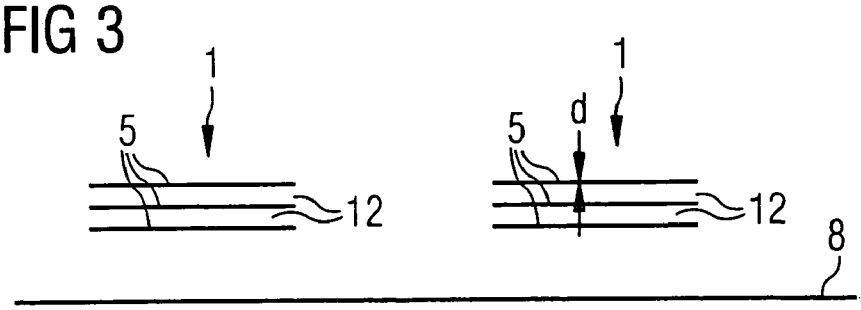

As shown in the cross-sectional view of FIGS. 2 and 3, respectively taken along II-II and III-III in FIG. 1, the conductor element 1 is fashioned as a multi-layer conductor, it thus has a number of layers 5 that each exhibit layer ends 6, 7 at the conductor ends 2, 3 shown in FIG. 1. The individual layers 5 thereby exhibit layer thicknesses d that, at the resonance frequency f, are smaller than the skin depth of the material of which the layers 5 are composed.

According to FIG. 2, the individual layers 5 are arranged concentric to one another. According to FIG. 3, the individual layers run parallel to a ground area (ground plane) 8. Both embodiments are equivalent insofar as it concerns the inventive procedure. Which embodiment is preferred therefore depends on the circumstances (which lie outside of the framework of the present invention), in particular on the specific application.

Figure 4:
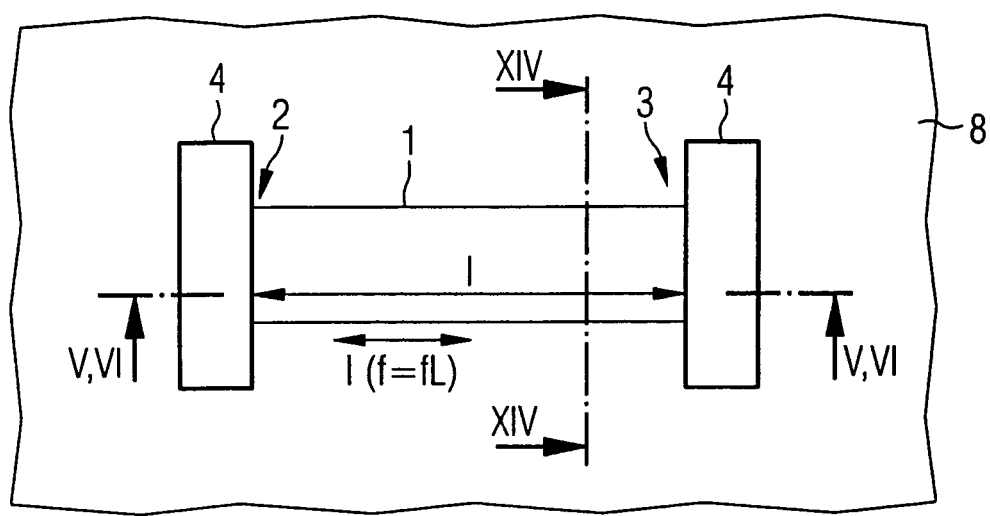
FIG. 4 shows a basic design of a further resonator for magnetic resonance applications in accordance with the invention.

FIG. 4 also shows a resonator for magnetic resonance applications that comprises a conductor element 1 that extends from a first conductor end 2 to a second conductor end 3. Here in operation of the conductor element 1 the resonance current oscillates in the conductor element 1 with the resonance frequency f from the first conductor end 2 to the second conductor end 3 and back. Furthermore, here as well a circuit 4 is present via which the conductor ends 2, 3 are coupled with one another. The circuit 4 again tunes the conductor element 1 to the resonance frequency f. However, since the conductor element 1 extends in a rod shape in the embodiment of FIG. 4, a ground area 8 is required. Only by means of the ground area 8 is it possible that the circuit 4 couples the conductor ends 2, 3 with one another.

Figure 5:
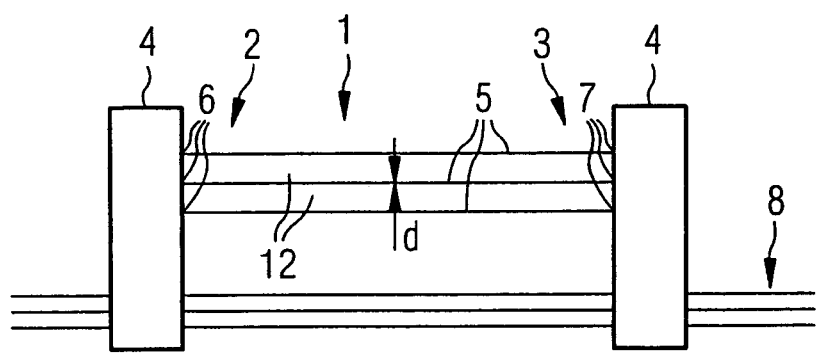
FIGS. 5 and 6 show examples of cross-sections of the resonator of FIG. 4.
Figure 6:
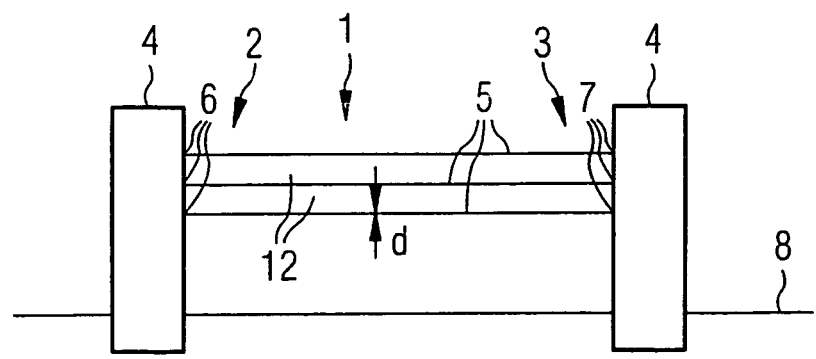

As is apparent from FIGS. 5 and 6, the conductor element 1 of FIG. 4 is fashioned as a multi-layer conductor. It thus likewise comprises a plurality of layers 5 that exhibit layer ends 6, 7 at the conductor ends 2, 3. The difference between FIGS. 5 and 6 is thereby that the ground area 8 in the embodiment according to FIG. 5 is likewise fashioned as a multi-layer conductor while in the embodiment of FIG. 6 the ground area 8 is fashioned in one layer (i.e. unitary). Here as well the layer thickness d is again smaller than the skin depth.

In FIGS. 2, 3, 5 and 6 conductor elements 1 are respectively shown which comprise three layers 5. This number of layers is retained in the subsequent illustration of the present invention that ensues in connection with FIGS. 7 through 12. However, the number of three layers 5 is purely exemplary and serves merely for explanation. Other numbers of layers 5, in particular significantly larger numbers, could also be used without further measures. Furthermore, it is noted that the conductor elements 1 shown in FIGS. 7 through 12 can be both the conductor elements 1 of FIGS. 1 through 3 and the conductor elements 1 of FIGS. 4 through 6. The connections of the layer ends 6, 7 shown in FIGS. 7 through 12 ensue if applicable via the ground area 8 of FIGS. 4 through 6.

If it were merely necessary to tune the conductor element 1 to the resonance frequency f, it would suffice to fashion the circuit 4 corresponding to FIG. 7. According to FIG. 7, the circuit 4 comprises only a single impedance adaptation circuit 9 that is directly connected with all layers 5. In this case the impedance adaptation circuit 9 would merely have to comprise one capacitor 10 and/or one coil 11. Normally it would even be sufficient when only one of the two elements 10, 11 (thus either the capacitor 10 or the coil 11) is present. Layer currents I1, I2, I3 that sum to the resonance current I would then flow in the layers 5. However, the layer currents I1, I2, I3 flowing in the layers 5 would normally not be of equal magnitude. The causes for this are production-conditional variances of the layers 5 among one another that are unavoidable as a rule. However, according to the present invention the circuit 4 should be fashioned such that, in operation of the conductor element 1 with the resonance frequency f, the layer currents I1, I2, I3 should be of equal magnitudes among one another. How this can be achieved in the resonators according to FIGS. 1 through 6 is subsequently explained in detail in connection with FIGS. 8 through 12.

Figure 10:
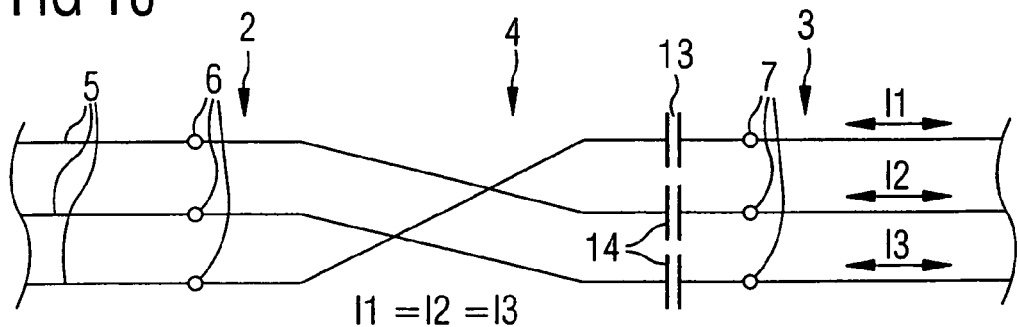

According to FIGS. 8, 9 and 10, the circuit 4 interconnects the layer ends 6, 7 with one another such that the layers 5 are connected with one another in series. This embodiment can be realized in connection with FIGS. 1 through 5 however not with the embodiment according to FIG. 6.

According to FIG. 8, the first (viewed in the current flow direction of the resonance current I) of the layers 5 connected in series and the last (viewed in the current flow direction of the resonance current I) of the layers 5 connected in series are not connected with one another by means of an electrical component of the circuit 4. In this case, a capacitive coupling between both layers 5 that are not connected with one another exists only via one (or more) unavoidable parasitic capacitances.

The circuit according to FIG. 8 can be reasonable in the individual case when, the tuning to the resonance frequency f is present due to the thickness of the layers 5, the spacing (separation) of the layers 5 from one another and of the dielectric constant of insulation material 12 arranged between the layers (see FIGS. 2, 3, 5 and 6). However, in the normal case it is necessary to provide further measures corresponding to FIGS. 9 and 10.

For example, according to FIG. 9 it is thus possible to connect the first (viewed in the current flow direction of the resonance current I) of the layers 5 connected in series and the last (viewed in the current flow direction of the resonance current I) of the layers 5 connected in series with one another by a capacitor 13 of the circuit 4. The capacitor 13 is thereby subsequently called a first capacitor 13.

In the embodiments of FIGS. 8 and 9, relatively large potential differences can result between the individual layers 5. It is therefore normally preferred when (corresponding to FIG. 10) the circuit 4 comprises further capacitors 14 (subsequently called second capacitors 14). The second capacitors 14 are connected in series with the first capacitor 13. Viewed in the current flow direction of the resonance current I, at least one of the layers 5 is thereby always arranged between the first capacitor 13 and the second capacitors 14. At least one of the layers 5 is respectively also arranged between the two capacitors 14 among one another. Losses occurring otherwise can thereby be prevented, or at least reduced.

According to FIG. 10, the circuit 4 likewise capacitors 13, 14 equal in number to the layers. This embodiment is particularly optimal.

Figure 11:
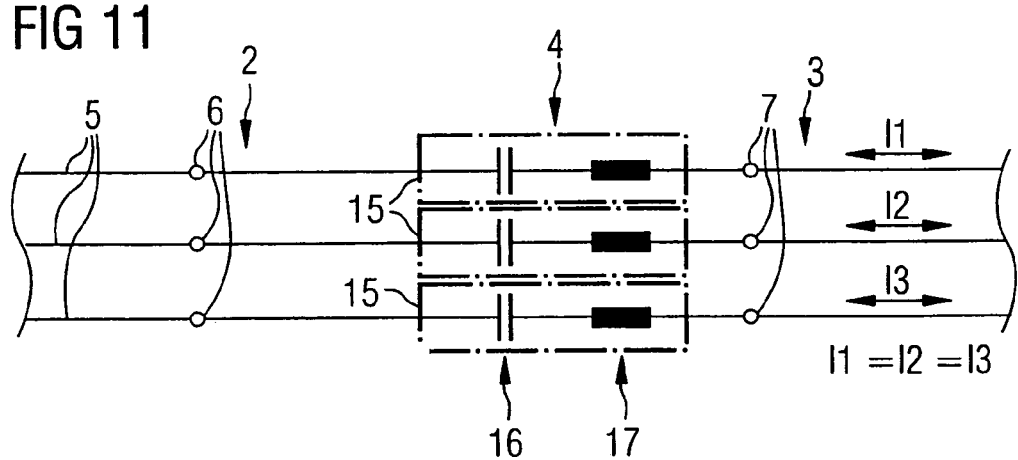
Figure 12:
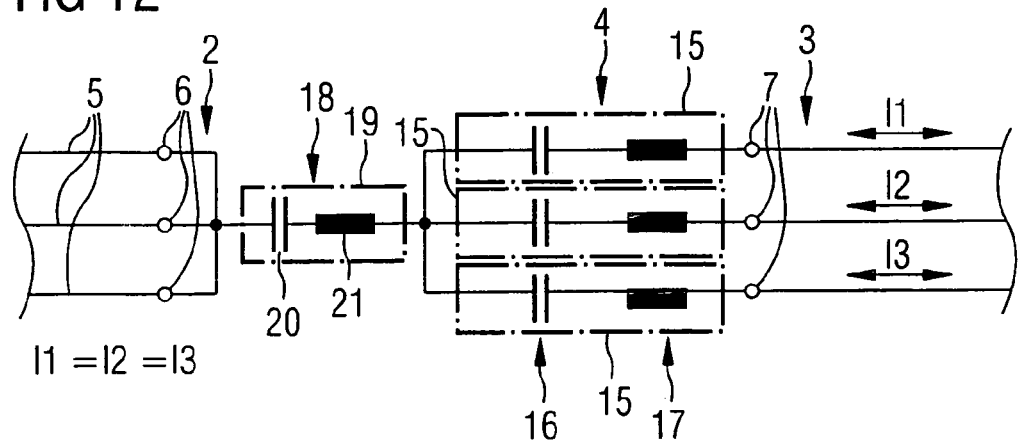

In contrast to FIGS. 8 through 10, the circuit 4 in FIGS. 11 and 12 interconnects the layer ends 6, 7 with one another such that the layers 5 are connected in parallel with one another. In this case the circuit 4 has an impedance adaptation circuit 15 for each layer 5, the impedance adaptation circuits being individually associated with the respective layer 5. Each impedance adaptation circuit 15 is formed by one capacitor 16 and/or one coil 17. The impedance adaptation circuits 15 are directly connected with one of the layer ends 6, 7 of the layer 5 associated with them.

According to FIGS. 11 and 12, the impedance adaptation circuits 15 have the capacitor 16 and the coil 17. However, it is normally sufficient when only one of these two elements 16, 17 is present, thus either only the capacitor 16 or only the coil 17.

According to FIG. 11 each impedance adaptation circuit 15 is also directly connected with the other of the layer ends 6, 7 of the layer 5 associated with it. In this case each layer 5 is thus tuned to the resonance frequency f by means of its respective impedance adaptation circuit 5, independent of the other layers 5.

The embodiment according to FIG. 11 can be realized in each of the embodiments of FIGS. 1 through 5, but not in the embodiment according to FIG. 6.

In contrast to this, in the embodiment according to FIG. 12 each impedance adaptation circuit 15 is connected via a connection region 18 with the other of the layer ends 6, 7 of the layer 5 associated with it, which connection region 18 is common to the impedance adaptation circuits 15.

It is possible that the connection region 18 is a simple connection. In this case the tuning of the layers 5 to the resonance frequency f ensues (as in FIG. 11) exclusively via the impedance adaptation circuits 15. However, as shown in FIG. 12 it is also possible that a residual circuit 19 is arranged in the connection region 18. The residual circuit 19 can thereby also be formed by a capacitor 20 and/or a coil 21. Only of these two elements 20, 21 is thereby normally present, thus either only the capacitor 20 or only the coil 21. However, both elements 20, 21 can also be present.

Figure 13:
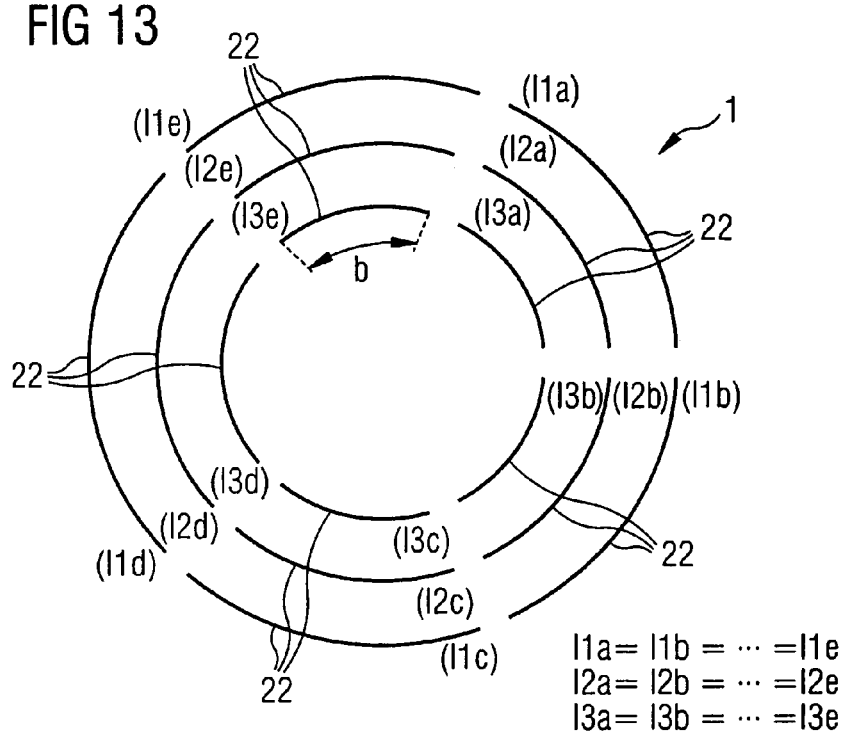
FIG. 13 shows a further example of a cross-section of the resonator of FIG. 1.
Figure 14:
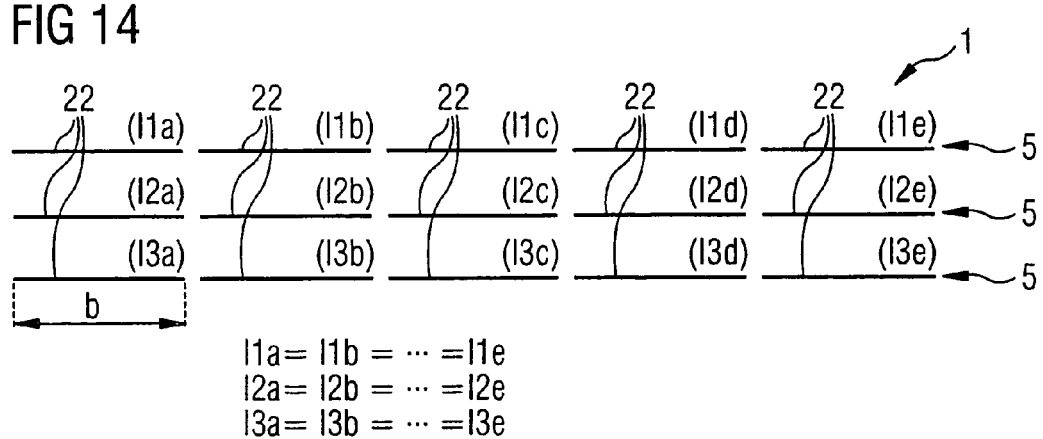
FIG. 14 shows a further example of a cross-section of the resonators of FIG. 1 or FIG. 4.

In the embodiments described in the preceding it was assumed that a homogeneous current distribution exists (as viewed transverse to the current flow direction) within each layer 5. This assumption is not always valid. In order to also achieve a uniform current distribution within each layer 5, as shown in FIGS. 13 and 14 (respectively taken through XIII and XIV in FIG. 1) it is possible to sub-divide the layers 5 into multiple strips 22. The strips 22 can exhibit strip widths b that, at the resonance frequency f, are greater than the skin depth of the material of which the strips 22 or the layers 5 are composed.

With a corresponding embodiment of the circuit 4, it can then be achieved that, given operation of the conductor element 1 at the resonance frequency f, strip currents I1a through I1e, I2a through I2e, I3a through I3e that are of equal magnitude among one another per layer 5 flow in the strips 22. The possible embodiments of the circuit 4 are thereby wholly analogous to the embodiments of the circuit 4 that was explained in the preceding in connection with FIGS. 8 through 12. It is merely to be taken into account that the circuits 4 of FIGS. 8 through 12 in this case do not have to interconnect the layers 5 with one another but rather the strips 22.

In this context it is noted that it is possible to combine various types of measures with regard to the interconnection of the strips 22 and the interconnection of the layers 5 with one another. For example, it is possible to connect the layers 5 with one another in series (corresponding to FIGS. 8, 9 and 10), however within each layer 5 to connect its strips 22 in parallel to one another (analogous to FIGS. 11 and 12). However, the same type of interconnection can naturally also be applied, for example a full parallel connection of all strips 22 of all layers 5 with one another.

Not only can multi-layer conductors be used in principle in resonators for magnetic resonance apparatuses by means of the inventive procedure, but also the desired advantage of multi-layer conductors can be achieved, namely a significant resistance reduction at the resonance frequency.

Although modifications and changes may be suggested by those skilled in the art, it is the intention of the inventors to embody within the patent warranted hereon all changes and modifications as reasonably and properly come within the scope of their contribution to the art.

We claim as our invention:

1. A resonator configured for magnetic resonance applications comprising:
   a conductor element extending from a first conductor end to a second conductor end, said conductor element comprising a multi-layer conductor having a plurality of layers, which respectively have layer ends at said first and second conductor ends; and
   a circuit electrically coupled to said first and second conductor ends that tunes said conductor element to a resonance frequency, said conductor element, at said resonance frequency, having a resonance current therein that oscillates from said first conductor end to said second conductor end and back to said first conductor end, said circuit causing respective layer currents of respectively equal magnitudes to flow in the respective layers of the multi-layer conductor during active operation of said conductor element at said resonance frequency.

2. A resonator as claimed in claim 1 wherein said circuit directly couples said first and second conductor ends with one another.

3. A resonator as claimed in claim 1 wherein said circuit couples said first and second conductor ends with one another through a ground area.

4. A resonator as claimed in claim 1 wherein said circuit interconnects said first and second layer ends with one another so that said layers are connected with one another in series.

5. A resonator as claimed in claim 4 wherein said plurality of layers include a first layer, as viewed in a current flow direction of said resonance current, and a last layer, as viewed in said current flow direction of said resonance current, and wherein said circuit comprises an electrical component between said first layer and said second layer so that said first layer and said second layer are not connected in series with one another.

6. A resonator as claimed in claim 4 wherein said plurality of layers include a first layer, as viewed in a current flow direction of said resonance current, and a last layer, as viewed in said current flow direction of said resonance current, and wherein said circuit comprises a capacitor connected between said first layer and said second layer that connects said first layer and said second layer in series with one another.

7. A resonator as claimed in claim 6 wherein said capacitor is a first capacitor, and comprising a second capacitor connected in series with said first capacitor, with at least one of said plurality of layers being connected between the first capacitor and the second capacitor as viewed in said current flow direction of said resonance current.

8. A resonator as claimed in claim 1 wherein said circuit interconnects the respective layer ends with one another to connect said plurality of layers in parallel with one another, and wherein said circuit comprises, for each layer in said plurality of layers, an impedance adaption circuit individually associated with that layer and directly electrically connected to one layer end of the layer individually associated with the impedance adaption circuit.

9. A resonator as claimed in claim 8 wherein each impedance adaption circuit comprises at least one of a capacitor and a coil.

10. A resonator as claimed in claim 8 wherein each impedance adaption circuit is directly connected with both layer ends of the layer individually associated with the impedance adaption circuit.

11. A resonator as claimed in claim 10 wherein each impedance adaption circuit is connected to one of the layer ends of the layer individually associated with the impedance adaption circuit via a connection region that is common to all of said impedance adaption circuits.

12. A resonator as claimed in claim 1 wherein said circuit comprises a residual circuit connected in said common connection region.

13. A resonator as claimed in claim 12 wherein said residual circuit comprises at least one of a capacitor and a coil.

14. A resonator as claimed in claim 1 wherein each of said layers in said plurality of layers comprises a plurality of strips, and wherein said circuit, during operation of said conductor element at said resonance frequency, causes respective strip currents to flow in the strips that are of equal magnitude with each other within the layer formed by the respective strips.

15. A resonator as claimed in claim 14 wherein said strips are comprised of strip material having a skin depth at said resonance frequency, and wherein said strips each have a strip width that is larger than said skin depth of said material at said resonance frequency.

* * * * *